Aug. 4, 1970    N. M. LOURIE    3,522,444
LOGIC CIRCUIT WITH COMPLEMENTARY OUTPUT STAGE
Filed March 17, 1967
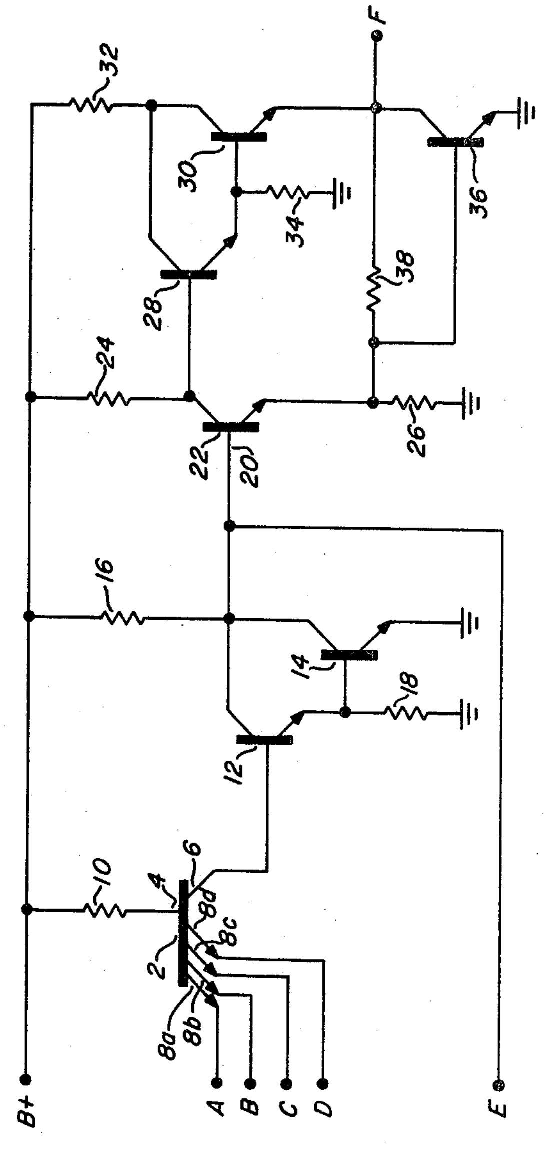
INVENTOR
NORMAN M. LOURIE
BY Richard J. Donahue
ATTORNEY 3,522,444

LOGIC CIRCUIT WITH COMPLEMENTARY OUTPUT STAGE

Norman M. Lourie, Needham, Mass., assignor to Honeywell Inc., Minneapolis, Minn., a corporation of Delaware Filed Mar. 17, 1967, Ser. No. 623,996
Int. Cl. H03k *19/08, 19/20*
U.S. Cl. 307—207 9 Claims

ABSTRACT OF THE DISCLOSURE

A high-speed semiconductor logic circuit adapted for fabrication as a monolithic circuit component. The circuit includes a multiple emitter type logic input element coupled by way of a phase inverter to a phase splitter driving, in turn, a pair of complementary operated output switches. The inverter is included to provide a desired additional signal inversion in the circuit, required to produce a non-inverted signal at the output, and is coupled to enhance the switching of the phase splitter as well as provide noise pulse immunity. The circuit further includes special signal bias circuitry to enhance the speed of the output switches.

BACKGROUND OF THE INVENTION

The present invention is concerned with a monolithic semiconductor of logic circuit adapted for use in high speed digital logic applications. Logic circuits of this general type have been known heretofore and a representative type of prior circuit is shown in a semiconductor component manufactured by the Fairchild Camera and Instrument Corporation and identified as a TTuL 103, Dual 4-Input gate.

It has been found that with the ever-increasing speed requirements for digital logic, it is necessary to provide logic circuits capable of handling digital pulses at higher speeds. In many digital logic circuit applications it is required that the phase of the output signals be the same as the input signals. This means that if there is any signal inversion in one stage of the circuit, a second inverter will be required and when so required, there may be a loss of overall circuit speed or noise sensitivity.

SUMMARY OF THE INVENTION

It is therefore an object of the present invention to overcome the problems heretofore encountered in this type of circuit and to provide a new and improved non-inverting type of semiconductor logic circuit that is adapted to provide high switching speeds and improved noise immunity.

By way of summary, the particular circuit contemplated in the present invention takes the form of a multi-stage switching circuit having, on the input, a multiple emitter semiconductor whose output is coupled into a phase inverter, the latter having a high input threshhold adapted to eliminate unwanted noise pulses. The phase inverter is connected at its output to a phase splitter which drives a pair of complementary switches, at least one of which has its input connected to a special bias circuit to enhance its switching speed.

Another object of the present invention is then to provide a new and improved digital logic circuit including a multiple emitter input element coupled into a phase inverter which, in turn, feeds a phase splitter driving a pair of complementary switches at the ontput, at least one of which is uniquely biased to enhance both its "turn on" and "turn off" switching speeds.

The foregoing objects and features of novelty which characterize the invention, as well as other objects of the invention, are pointed out with particularity in the claims annexed to and forming a part of the present specification. For a better understanding of the invention, its advantages and specific objects attained with its use, reference should be had to the accompanying drawing and descriptive matter in which there is illustrated and described a preferred embodiment of the invention.

The single figure in the drawing is a schematic illustration of an embodiment of the present invention.

DESCRIPTION OF THE PREFERRED EMBODIMENT

Referring now to the single figure in the drawing, the illustrated logic circuit includes a gating transistor 2 having a base 4, a collector 6 and four separate emitters 8*a*, 8*b*, and 8*d*, each of which is connected to a separate one of the logic circuit input terminals A, B, C, and D. The base 4 of transistor 2 is connected to a resistor 10 which, in turn, is connected to a positive direct current potential terminal B+. The collector 6 of transistor 2 is connected to the base of a transistor 12 which is arranged in combination with a transistor 14, to form a Darlington phase inverter configuration. Thus, the collectors of transistors 12 and 14 are joined together and are coupled to the B+ teminal by a mutually shared collector resistor 16. The emitter of transistor 12 is connected to the base of transistor 14 and is coupled to a reference voltage terminal, hereinafter termed ground, by means of a resistor 18. The emitter of transistor 14 is directly connected to ground.

The joined collectors of transistors 12 and 14 are further connected to the base 20 of a phase splitter transistor 22, the latter having its collector coupled to the B+ terminal by means of a resistor 24, and its emitter coupled to ground by means of a resistor 26. An additional input terminal E is connected to the base 20 of transistor 22. The input terminal E provides a convenient means for coupling additional gating structure, similar to that described thus far, to the base of transistor 20, and thus expand the logic capacity of the circuit.

The collector of transistor 22 is further connected to the base of a transistor 28 which is arranged in combination with a transistor 30 to form a second Darlington type configuration. Thus, the collectors of transistors 28 and 30 are joined together and are coupled to the B+ terminal by a mutually shared collector resistor 32. The emitter of transistor 28 is connected to the base of transistor 30 and is coupled to ground by means of a resistor 34. The emitter of transistor 30 is connected to the output terminal F of the logic circuit. The emitter of transistor 22 is further connected to the base of a transistor 36, whose collector is connected to the output terminal F and whose emitter is connected to ground. A feedback resistor 38 is connected between the emitter of the phase splitter transistor 22 and the logic circuit output terminal F.

The operation of the logic circuit described above is best explained by assigning respresentative voltage values to the signals applied to the circuit. The voltage applied to the B+ terminal is preferably in the order of 5.0 volts while the logic signals applied to the input terminals A–D have a nominal low voltage level of 0.2 volt and a nominal high voltage level of 3.5 volts. References will be made to the base-emitter voltage $V_{be}$ required to energize the circuit transistors, which voltage for each transistor is typically in the order of 0.8 volt. Reference will also be made to the voltage $V_{ce}$ which is established across the collector-emitter elements of the fully-energized, i.e. saturated transistors, which voltage for each transistor is typically in the order of 0.2 volt. Since the aforementioned input signal levels and transistor voltage parameters are merely representative values, they should not be construed so as to limit the scope of the invention.

It will be initially assumed that at least one of the logic signals applied to the input terminals A–D is at its low voltage level of 0.2 volt. Transistor 2 will therefore be conducting current through at least one of its base-emitter junctions, causing its collector to assume a value of $V_{in}$ plus $V_{ce}$ volts, or approximately 0.4 volt. This voltage value is far below the $2V_{be}$ volts, or 1.6 volts required to activate the Darlington-connected transistors 12 and 14. The voltage at the joined collectors of transistors 12 and 14 is at this time sufficiently positive to activate the transistors 20 and 36, and is clamped at their cumulative $V_{be}$ values, or 1.6 volts. The conduction of transistor 36 causes the output terminal F to assume the $V_{ce}$ voltage of transistor 36, or 0.2 volt. At this time, the voltage appearing at the collector of transistor 22 is the sum of the $V_{be}$ voltage of transistor 36 and the $V_{ce}$ voltage of transistor 22, or approximately 1.0 volt. This voltage is less than the $2V_{be}+V_{ce}$ volts required for the conduction of transistors 28 and 30. Thus, the transistors 28 and 30 will be effectively disconnected from the output terminal F and will have no effect thereon.

An important feature of the present invention should be noted at this point. Noise pulses which are commonly present on the circuit input terminals A–D will have no effect on the present state of the circuit unless they exceed $2V_{be}-V_{ce}$ volts, or 1.4 volts. Thus, the circuit exhibits a high degree of immunity to input noise pulses.

It will now be assumed that all of the logic signals applied to the input terminals A–D are at their high voltage level, or 3.5 volts. Current now flows through the base-collector junction of transistor 2 and through the base-emitter junctions of transistors 12 and 14, rendering them conductive and clamping the voltage on the collector 6 of transistor 2 at $2V_{be}$ volts, or 1.6 volts. The voltage at the joined collectors of transistors 12 and 14 is the sum of the $V_{be}$ voltage of transistor 14 and the $V_{ce}$ voltage of the transistor 12, or 1.0 volt. This voltage is not sufficiently positive to exceed the $2V_{be}$ volts required for energization of the transistors 22 and 36. The transistor 36 is essentially disconnected from the output terminal F. The voltage on the collector of transistor 22, however, approaches B+ potential, or 5 volts. Transistors 28 and 30 are rendered conductive to cause the output terminal F to assume a value of B+ minus $2V_{be}$ volts, or approximately 3.4 volts.

Briefly summarizing the operation of the circuit, if one or more of the input signals is at its low value of 0.2 volt, the output terminal F assumes its low value of 0.2 volt. If, on the other hand, all of the logic signals applied to the input terminals A–D are at their high value of 3.5 volts, the output terminal F assumes its high value of approximately 3.4 volts.

The provision of the phase inverter stage intermediate the multiple emitter gating transistor 2 and the phase-splitter transistor 22 does not, as might be expected, decrease its overall switching speed. In the absence of the inverter stage, the switching speeds of the gating transistor 2 and the transistor 22 are considerably slower, due to the time required for the gating transistor 2 to reduce the charge stored in the intrinsic base-collector capacitance of transistor 22. This is particularly the case since the voltage at the collector of transistor 22 is required to change by approximately 4 volts. The higher drive current provided by the Darlington type phase inverter stage, will rapidly switch the transistor 22. The time required to switch the added inverter stage is small, since its collector voltage is only required to change by approximately 0.6 volt. The increased switching speeds of the multiple emitter transistor 2 and phase splitter transistor 22 thus compensate for the added switching time of the inverter stage.

Because of the current gain and isolation provided by the Darlington inverter stage, it is possible to reduce the value of the resistor 26. The reduction in the value of resistor 26 decreases the time required to remove the charge stored in the transistor switch 36, and thus decrease the time required to turn it off. This not only increases the overall operational speed of the circuit, but reduces the amplitude and duration of current spikes formed in the power source during the switching interval when transistor 30 is in the process of turning on and transistor 36 is in the process of turning off.

The feedback resistor 38 forms a voltage divider with the emitter resistor 26 between the output terminal F and ground. The values of resistors 38 and 26 are selected such that the voltage at their junction, when the output terminal F is at its high level of 3.4 volts, is just below the conduction threshhold voltage $V_{be}$ of the transistor 36. The slightly positive biasing potential applied to the base of transistor 36, which may for example be in the order of 0.5 volt while not sufficient to energize the transistor 36, partially charges the intrinsic capacitance of the transistor 36 so as to markedly reduce the time subsequently required to energize the latter.

Having now described the invention, what is claimed as new and novel, and for which it is desired to secure Letters Patent is:

1. A logic circuit comprising a multiple emitter transistor gate having its base coupled to a DC potential, a separate input terminal connected to each emitter of said gate adapted to receive a bilevel logic signal, an inverter stage including a first transistor and a second transistor, said first transistor having its base coupled to the collector of said multiple emitter transistor gate and its emitter coupled to a reference point, the collectors of said first and second transistors being connected to a common junction point which is further coupled to said DC potential, said second transistor having its base connected to the emitter of said first transistor and having its own emitter coupled to said reference point, at least one additional input terminal coupled to said common junction point, a phase splitter transistor having its input coupled to said junction point, an output terminal, and a pair of complementary operated transistor switching means connected to be controlled from the emitter and collector respectively of said phase splitter transistor, said pair of transistor switching means being series-connected through said output terminal and being coupled between said DC potential and said reference point.

2. The apparatus of claim 1 wherein said phase splitter transistor has its collector coupled to said DC potential, said apparatus including an emitter resistor coupled between the emitter of said last-recited transistor and said reference point, and a feedback resistor connected between said output terminal and said last-recited transistor emitter, said feedback resistor forming a voltage divider with said emitter resistor between said output terminal and said reference point adapted to bias one of said complementary transistor switching means to a point immediately below the switching threshold of the latter.

3. The apparatus of claim 2 wherein one of said pair of complementary operated transistor switching means comprises a transistor having its collector connected to said output terminal and its emitter connected to said reference point, the base of said last-recited transistor being connected to the emitter of said phase splitter transistor.

4. The apparatus of claim 3 wherein the other one of said pair of complementary operated transistor switching means comprises a first transistor having its base connected to the collector of said phase splitter transistor, the emitter of said first transistor being coupled to said reference point, and a second transistor having its collector connected to the collector of said first transistor and further coupled to said DC potential, the base of said second transistor being coupled to the emitter of said first transistor, and the emitter of said second transistor being connected to said output terminal.

5. A logic circuit comprising transistor gating means, a phase splitter transistor having its base coupled to receive output signals from said transistor gating means and having its collector coupled to a source of DC potential, an emitter resistor connecting the emitter of said phase splitter transistor to a reference point, an output terminal, first and second complementary operated transistor switching means connected in series through said output terminal, said series-connected switching means being coupled between said DC potential and said reference point, said first transistor switching means including a Darlington circuit configuration having its input coupled to the collector of said phase splitter transistor, said second transistor switching means having its input coupled to the emitter of said phase splitter transistor, and a feedback resistor connected between said output terminal and the emitter of said phase splitter transistor to form a voltage divider with said emitter resistor, said feedback resistor being adapted to bias said second transistor switching means to a point immediately below the switching threshold of the latter.

6. The apparatus of claim 5 wherein said Darlington circuit configuration comprises a first transistor having its base connected to the collector of said phase splitter transistor and its emitter coupled to said reference point, and a second transistor having its collector connected to the collector of said first transistor and further coupled to said DC potential, the base of said second transistor being coupled to the emitter of said first transistor and the emitter of said second transistor being connected to said output terminal.

7. The apparatus of claim 5 wherein said second transistor switching means comprises a transistor having its collector connected to said output terminal and its emitter connected to said reference point, the base of said last-recited transistor being connected to the emitter of said phase splitter transistor.

8. The apparatus of claim 5 wherein said logic circuit is constructed as an integrated circuit element, said element including a plurality of input terminals coupled to said transistor gating means, an inverter stage coupled between said transistor gating means and the base of the phase splitter transistor, and an additional input terminal on said element connected to said last-recited base.

9. A logic circuit constructed in integrated form and including in combination: a plurality of logic signal input terminals, a first transistor having a collector, a base, and a plurality of emitters connected one each to said logic signal input terminals, a positive DC voltage terminal, means resistively coupling the base of said first transistor to said DC voltage terminal, second and third transistors, a means coupling the collector of said first transistor to the base of said second transistor, a junction point, each of the second and third transistors having its collector connected to said junction point, the latter being resistively coupled to said DC voltage terminal, a ground terminal, said second transistor having its emitter resistively coupled to said ground terminal and connected to the base of said third transistor, said third transistor having its emitter connected to said ground terminal, an additional data input terminal coupled to said junction point, a fourth transistor having its base connected to said junction point, means for resistively coupling the collector of said fourth transistor to said DC voltage terminal, means for resistively coupling the emitter of said fourth transistor to said ground terminal, fifth and sixth transistors having their collectors joined together and resistively coupled to said DC voltage terminal, said fifth transistor having its base connected to the collector of said fourth transistor and its emitter resistively coupled to said ground terminal and connected to the base of said sixth transistor, a seventh transistor, a data output terminal, means connecting the emitter of said sixth transistor and the collector of said seventh transistor to said data output terminal, said seventh transistor having its base connected to the emitter of said fourth transistor and its emitter connected to said ground terminal, and a feed back resistor connected between said output terminal and the emitter of said fourth transistor.

References Cited

UNITED STATES PATENTS

| | | | |
|---|---|---|---|
| 2,995,712 | 8/1961 | Montgomery | 307—315 X |
| 3,039,009 | 6/1962 | Gray et al. | 307—315 X |
| 3,384,766 | 5/1968 | Kardash | 307—299 X |

JOHN S. HEYMAN, Primary Examiner

U.S. Cl. X.R.

307—213, 215, 218, 299, 315